United States Patent [19]
Chinoy et al.

[11] Patent Number: 5,672,282
[45] Date of Patent: Sep. 30, 1997

[54] PROCESS TO PRESERVE SILVER METAL WHILE FORMING INTEGRATED CIRCUITS

[75] Inventors: Percy Chinoy, Burlington; Joel Goodrich, Westford, both of Mass.

[73] Assignee: The Whitaker Corporation, Wilmington, Del.

[21] Appl. No.: 591,063

[22] Filed: Jan. 25, 1996

[51] Int. Cl.⁶ .................. B44C 1/22; C23F 1/00
[52] U.S. Cl. .......... 216/41; 216/100; 156/656.1; 156/659.11
[58] Field of Search .............. 216/21, 40, 41, 216/36, 100; 156/656.1, 659.11, 631.1

[56] References Cited

U.S. PATENT DOCUMENTS

| | | |
|---|---|---|
| 3,490,943 | 1/1970 | Werdt. |
| 4,940,495 | 7/1990 | Weber et al. ............... 136/256 |
| 4,946,376 | 8/1990 | Sharma et al. ............. 428/620 |
| 5,100,835 | 3/1992 | Zheng ....................... 437/184 |
| 5,160,793 | 11/1992 | Zheng ....................... 428/620 |
| 5,250,120 | 10/1993 | Takada et al. .............. 136/256 |
| 5,389,904 | 2/1995 | Tao et al. ................... 333/246 |
| 5,406,122 | 4/1995 | Wong et al. ................ 257/753 |
| 5,409,777 | 4/1995 | Kennedy et al. ............ 428/411.1 |
| 5,451,818 | 9/1995 | Chan et al. ................. 257/728 |

*Primary Examiner*—William Powell

[57] ABSTRACT

A process to form integrated circuits comprising silver metal circuits. Deposition techniques such as sputtering, not plating, upon substrates to form such silver metal circuits are common. However in the conventional processes to remove the resist and the metal overlaying the resist, these conventional processes are deleterious to the silver metal. Thereby a new process is provided. This new process entails the metal overlaying the resist of the wafer is initially removed by a high pressure force. The resist, in this new process, is then removed by a benign stripper solution having the temperature of the solution raised to the highest temperature without degrading the stripper solution and said circuit is exposed to said stripper solution for one to five minutes.

10 Claims, 2 Drawing Sheets

PROCESS TO PRESERVE SILVER METAL WHILE FORMING INTEGRATED CIRCUITS

FIELD OF THE INVENTION

The present invention relates to thin film metallization of microwave integrated circuits in which silver is used in fabrication.

BACKGROUND OF THE INVENTION

Gold has traditionally been the metallization of choice for microwave devices and integrated circuits on semi-insulated substrates, such as Silicon, Gallium Arsenide, or glass substrates.

The major disadvantage of gold is its high material cost. This is particularly true for liftoff processes which use e-beam evaporation techniques where an entire chamber gets coated with gold. As higher throughput requirements drive towards larger capacity evaporators with longer throw distances, the amount of gold not deposited on wafers increase. Even though the metals coating the evaporation are reclaimed, the cost of reclaiming is substantial and there is still some gold that is wasted. Processes like plating are less wasteful since the plating deposits gold only where needed but there are problems like difficulties in fine line resolution, field metal etching, and forming composite metal structures (example: Ti-Pt-Au-Ti or TiW-Au-Ti W).

As alternative to using gold, silver has been proposed to replace gold. Silver, however, has some problems in integrated circuit designs. These problems involve the processing of silver wherein the silver is either evaporated (such as electron-beam (e-beam)) or sputtered techniques (hereinafter referred to as deposition).

In processing silver under conventional integrated circuit deposition processes, silver gets etched easily by many acids and alkali used in these processes. Moreover, the applied resist in a conventional process has a negative profile 13 which ensures during metal depostion that there is a break between the metal overlaying the substrate and the metal overlaying the resist. In particular, a conventional metal lift-off process involves soaking a circuit (also called a wafer) in a stripper bath in the presence of ultrasonic agitation. This lift off process entails the stripper solution penetrates through this break in the metal and dissolves the resist. Depending on the density and size of the metal pattern, this process could take a long time, usually greater than an hour.

Moreover, if there happens to be any water on the wafer or in the stripper bath, the water reacts with the stripper bath to form an acid. This acid in turn reacts with the pure silver to form silver oxide. Silver oxide is not as conductive as pure silver, thus silver oxide is undesirable.

Another conventional process to form integrated circuits entails the use of an oxygen plasma technique to remove the residual resist of the lift off process. An oxygen plasma technique will oxidize silver as well, if silver is exposed as it usually is on the sides of a composite metal structure like Ti-Pt-Ag-Pt-Ti.

OBJECTS OF THE INVENTION

An object of the present invention is to have a process that diminishes the attack on silver to form an oxide in a method to form integrated circuits.

Another object of the present invention is to find a means to decrease the time an integrated circuit remains in contact with a stripper solution and removes all the resist.

Embodiments of the invention will now be described with reference to the accompanying drawings, according to which:

SUMMARY OF THE INVENTION

A method of making an integrated circuit is detailed in the present invention. The method entails a multistep process. In the first step a substrate is divided into a first area and a second area. A resist material, in another step, overlays the first area of a substrate. A metal composite comprising silver is deposited upon the resist and the second area of the substrate to a desired depth in a third step. A high pressure force is subsequently applied to the circuit thereby removing the metal overlaying the resist. Finally, applying a benign stripping solution having a temperature over 100° C. to the circuit for one to five minutes to remove the resist and any residue resist.

DETAILED DESCRIPTION OF THE INVENTION

Figure 1:
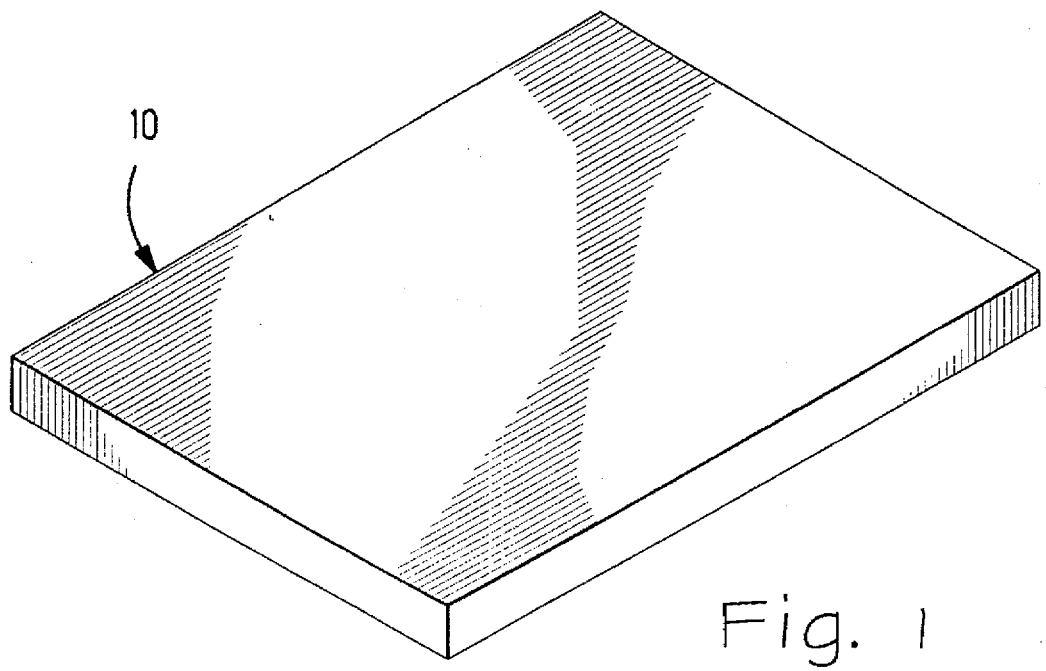
FIG. 1 is an isometric view of the substrate.

With reference to FIGS. 1, a passive microwave integrated circuit process is illustrated. This process entails fabricating conductors, resistors, capacitors, inductors and air bridges to a substrate.

Figure 2:
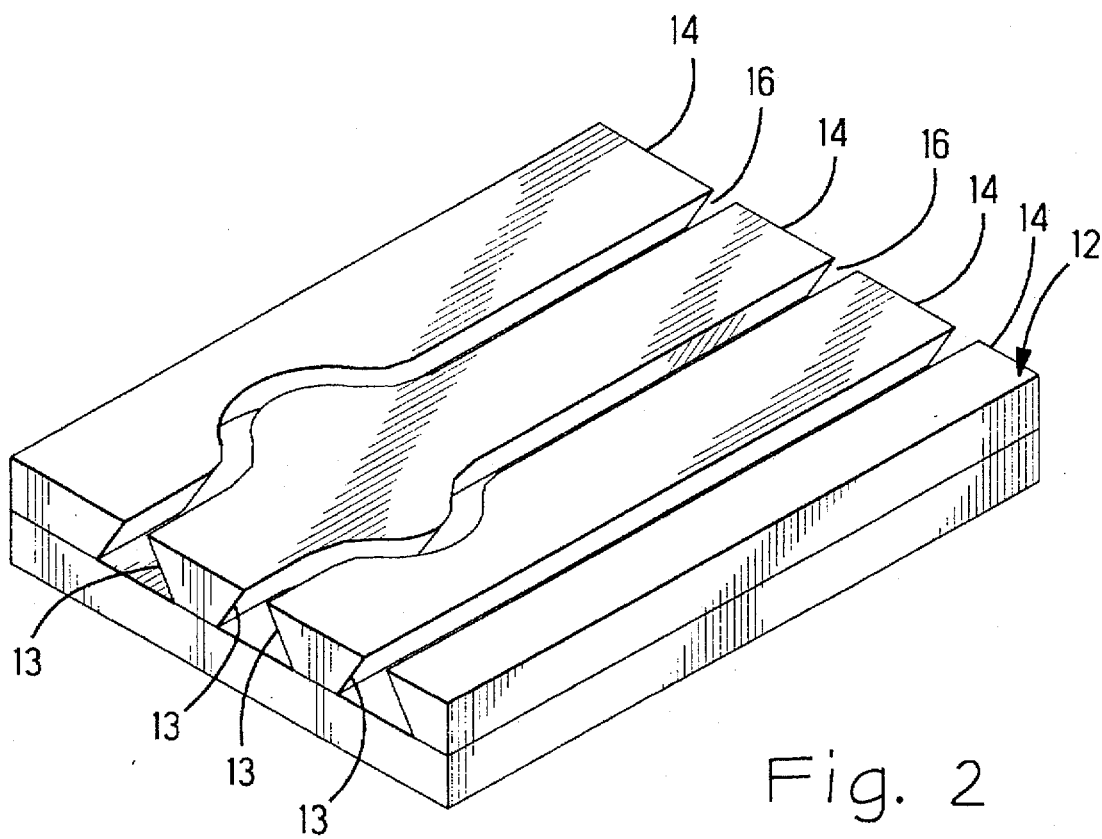
FIG. 2 is an isometric view of the resist layer overlaying the substrate and dividing the substrate into masked area and application area.

A substrate, such as gallium arsenide, silicon or glass, is cleaned, as identified as 10. In FIG. 2, a removable resist layer 12 is applied to the cleaned substrate.

When the resist layer is applied, the resist layer divides the substrate into two types: a masked area 14 and an application area 16. In this embodiment, the resist is an ultraviolet-stabilized photoresist. The photoresist is applied upon the substrate. A mask is applied to the resist coated substrate. The mask is designed to shield the photoresist where the application area is to be located. The masked photoresist is then exposed with ultraviolet light. The exposed photoresist becomes etch resistant while the non-exposed photoresist is capable of being etched away. The non-exposed photoresist is etched away. Thereby creating a masked area on the substrate and an application area on the substrate.

Figure 3:
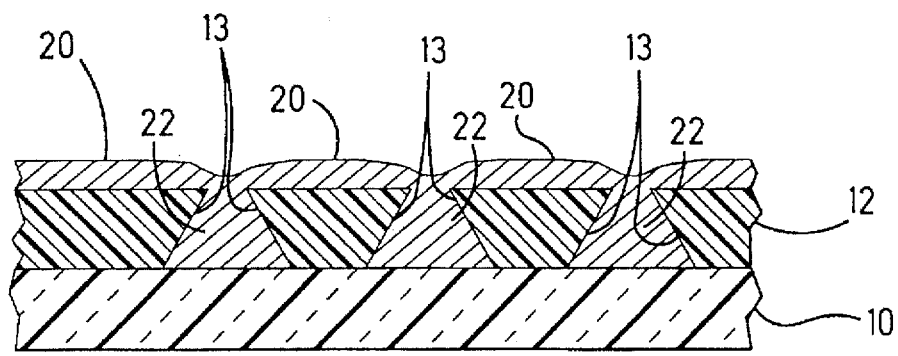
FIG. 3 is a side view of the deposited metal layer overlaying the resist layer and the application area.
Figure 6:
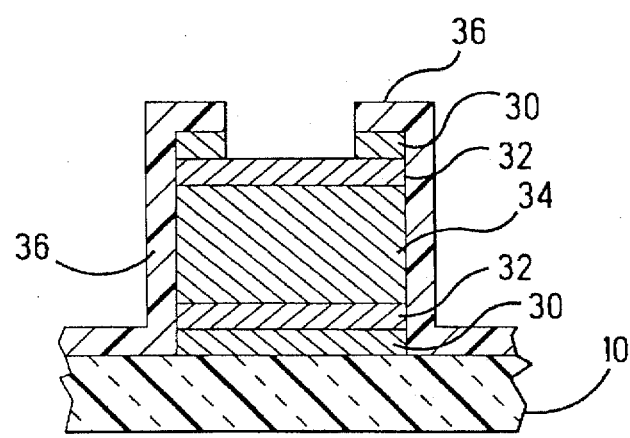
FIG. 6 is an enlarged view of the metal layer overlaying the substrate and encapsulated by a nitride layer.

A conductive metal composite layer 18 (referred to as metal layer) comprising silver is applied to the resist coated substrate, as referenced in FIG. 3. The application of the metal layer occurs by deposition techniques, such as e-beam or sputtering techniques. The metal layer includes silver composites wherein the other metals of the composite are selected from the group consisting of titanium, platinum, or gold. For example, such metal composites, as illustrated in FIG. 6, include titanium 30-platinum 32-silver 34-platinum 32-titanium 30 and titanium-platinum-silver-gold.

Since the metal layer is being applied by deposition techniques, the metal layer coats the entire substrate. Thus, the metal layer overlays the masked area 20 and the application area 22 of the substrate to a desired depth to form a wafer.

The metal layer overlaying the masked area 20 of the substrate is undesired. Thus, the metal layer overlaying the masked area of the substrate is removed.

Removing the metal layer overlaying the masked area of the substrate entails a two step process.

The first step involves applying a high pressure force upon the metal coated substrate. In particular, the high pressure force can be a high pressure water jet.

Figure 4:
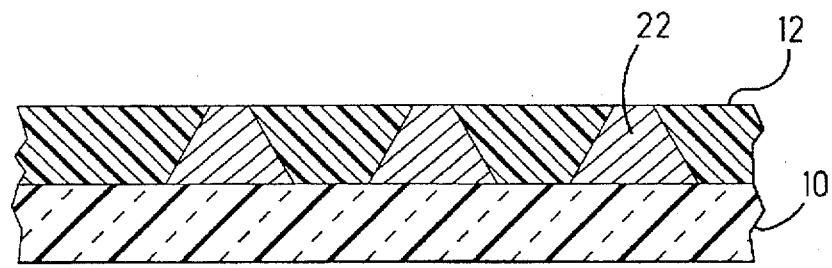
FIG. 4 is a side view of the circuit when the metal layer overlaying the resist layer is removed.

The metal layer overlaying the resist layer has a low bonding force to the resist. In contrast, the metal layer overlaying the application area 22 of the substrate and the resist layer 12 overlaying the substrate have a greater bonding force to the substrate 10 than the metal layer overlaying the resist layer 20. Thus, when the high pressure force is applied to the wafer, the metal layer overlaying the resist is removed as illustrated in FIG. 4.

Once the metal layer overlaying the resist is removed, the resist is subsequently removed in the second step of the two step process.

Figure 5:
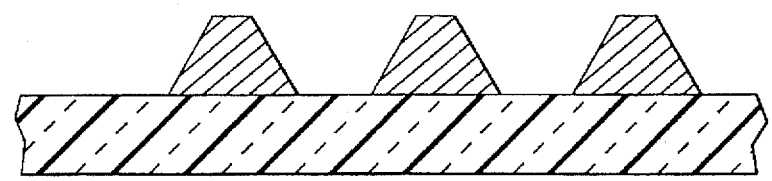
FIG. 5 is a side view of the circuit when the resist is removed.

The second step, as illustrated in FIG. 5, involves removing the resist layer. The resist layer is removed in this embodiment by applying a benign stripper solution upon the substrate. A benign stripper solution has a low reaction rate to form an acid with water and simultaneously has a sufficient reaction rate with resist to remove the resist. Such a benign stripper solution is ST-22 by ACSI, Inc.

Conventionally, a stripper solution, even in a bath, does not remove all the resist in one application. Thus, residues of the resist remain on the wafer. Plasma etching is used in conventional techniques to remove the resist residue. However, since plasma etching causes the silver to form into silver oxide, plasma etching to remove the residue of photoresist is a deleterious technique. There is a need to ensure that there is minimal to no residue resist on the wafer.

In this invention, the temperature of the stripper solution is raised to the highest temperature without degrading the stripper composition. In this example with ST-22, the highest temperature was above a hundred degrees Celsius. Preferably, the temperature of the stripper solution ranges from 110° to 130° C., more preferably 120° C. By raising the temperature of the stripper solution, there was no residue of resist on the wafer. Thus, raising the temperature of the stripper solution above a hundred degrees Celsius is a means to ensure there is minimal to no residue resist on the wafer.

Applying the benign stripper solution entails using a system that avoids the potential build up of water contamination, which in turn decreases the potential of acid build up in the stripper solution. A system used in this invention, entails that the metal layer overlaying the resist layer is removed by a high pressure water jet while the wafer is spun. The wafer, not having a metal layer overlaying the resist, continues to be spun and simultaneously has the stripper solution dispensed upon the wafer. The dispensing of the stripper solution entails that the stripper solution is not in a bath system but in a means that ensures that the stripper solution is not reused for subsequent wafers. One means to accomplish the application of the benign stripper solution is to spray the stripper solution upon the wafer. A means to spray the solution is through a modified Wafertrac® machine of General Signal Technology Corporation. Thereby, the wafer is exposed to the stripper solution for no longer than five minutes, ranging from one to five minutes and preferably two to four minutes.

A nitride layer 36, such as silicon nitride, is applied to the metal layers as illustrated in FIG. 6. The nitride layer is can be applied in various means, one such means is plasma enhanced vapor deposition. By applying the nitride layer to the metal layer, the nitride layer ensures the silver is encapsulated. Thereby decreasing the opportunities that the silver will form into a silver oxide.

The process illustrated above for the application of conductive metals upon a substrate is also utilized for air bridges on integrated circuit designs.

Thus it is apparent that in accordance with the present invention an apparatus that fully satisfies the objectives, aims and advantages is set forth above. While the invention has been described in conjunction with a specific embodiment, it is evident that may alternatives, modifications, and variations will become apparent to those skilled in the art in light of the foregoing description. Accordingly, it is intended that the present invention embrace all such alternatives, modifications, and variations as fall within the spirit and broad scope of the appended claims.

The invention claimed is:

1. A method of making an integrated circuit; said method entails:
   a) providing a substrate divided into a first area and a second area;
   b) applying a resist material upon said first area of substrate;
   c) applying a conductive metal composite comprising silver upon said resist and said second area of said substrate to a desired depth; and the method is characterized in the steps of:
   d) applying a high pressure force to said circuit to remove said metal overlaying said resist, and
   e) applying a benign stripping solution having the temperature of the solution raised to the highest temperature without degrading the stripper solution and said circuit is exposed to said stripper solution for one to five minutes.

2. A method of making an integrated circuit according to claim 1 wherein the step of applying a high pressure force is by a high pressure water jet.

3. A method of making an integrated circuit according to claim 1 wherein the step of applying a conductive metal composite comprising silver is applied by a sputtering technique.

4. A method of making an integrated circuit according to claim 1 wherein the step of applying a conductive metal composite comprising silver is applied by an e-beam technique.

5. A method of making an integrated circuit according to claim 1 wherein the step of applying a benign stripping solution occurs not in a bath system.

6. A method of making an integrated circuit according to claim 1 wherein the step of applying a benign stripping solution occurs by spraying said solution upon said circuit while said circuit is spun.

7. A method of making an integrated circuit according to claim 1 wherein the step of applying a conductive metal composite comprising silver wherein the other metals of the composite are selected from the group consisting of titanium, platinum, or gold.

8. A method of making an integrated circuit according to claim 1 wherein the step of applying a benign stripping solution occurs at a temperature around 120° C.

9. A method of making an integrated circuit; said method entails:
   a) providing a substrate divided into a first area and a second area;
   b) applying a resist material upon said first area of substrate;
   c) applying a conductive metal composite comprising silver upon said resist and said second area of said substrate to a desired depth; and the method is characterized in the steps of:
   d) applying a high pressure force to said circuit to remove said metal overlaying said resist,
   e) applying a benign stripping solution having the temperature of the solution raised to the highest temperature without degrading the stripper solution and said circuit is exposed to said stripper solution for one to five minutes, and
   f) applying a nitride layer upon said circuit.

10. A method of making an integrated circuit; said method entails:
   a) providing a substrate divided into a first area and a second area;
   b) applying a resist material upon said first area of substrate;
   c) applying to a desired depth a conductive metal composite comprising silver upon said resist and said second area of said substrate; and the method is characterized in the steps of:
   d) applying a high pressure force to said circuit to remove said metal overlaying said resist, and
   e) applying a benign stripping solution having the temperature of the solution raised to the highest temperature without degrading the stripper solution and said circuit is exposed to said stripper solution for one to five minutes,
   f) applying an air bridge upon said substrate by following steps a–e; and
   g) applying a nitride layer upon said circuit.

* * * * *